(12) United States Patent
Cowen

(10) Patent No.: US 8,658,478 B2
(45) Date of Patent: Feb. 25, 2014

(54) TRANSISTOR STRUCTURE FOR IMPROVED STATIC CONTROL DURING FORMATION OF THE TRANSISTOR

(75) Inventor: Timothy A. Cowen, Lower Burrell, PA (US)

(73) Assignee: Advantech Global, Ltd, Tortola (VG)

( * ) Notice: Subject to any disclaimer, the term of this patent is extended or adjusted under 35 U.S.C. 154(b) by 536 days.

(21) Appl. No.: 12/888,723

(22) Filed: Sep. 23, 2010

(65) Prior Publication Data
US 2012/0074471 A1    Mar. 29, 2012

(51) Int. Cl.
*H01L 21/00* (2006.01)
(52) U.S. Cl.
USPC .................................. 438/149; 257/E21.586
(58) Field of Classification Search
USPC .................... 438/149, 151, 680; 257/E21.586
See application file for complete search history.

(56) References Cited

U.S. PATENT DOCUMENTS

| | | | |
|---|---|---|---|
| 4,331,758 A * | 5/1982 | Luo | ............................... 438/151 |
| 4,335,161 A | 6/1982 | Luo | |
| 2003/0054586 A1 | 3/2003 | Shtein et al. | |
| 2003/0228715 A1 | 12/2003 | Brody et al. | |
| 2007/0102697 A1 | 5/2007 | Chen et al. | |

* cited by examiner

*Primary Examiner* — Quoc Hoang
(74) *Attorney, Agent, or Firm* — The Webb Law Firm

(57) ABSTRACT

A method of forming a shadow mask vapor deposited transistor includes shadow mask vapor depositing a semiconductor segment. An electrically conductive drain contact is shadow mask vapor deposited on a first part of the semiconductor segment and a first insulator is shadow mask vapor deposited on the drain contact. An electrically conductive source contact is shadow mask vapor deposited on a second part of the semiconductor segment spaced from the drain contact and a second insulator is shadow mask vapor deposited on the source contact. A third insulator is shadow mask vapor deposited over at least part of each of the first and second insulators and the semiconductor segment between the drain contact and the source contact. An electrically conductive gate contact is shadow mask vapor deposited on the third insulator and in spaced relation to the semiconductor segment between the drain contact and the source contact.

9 Claims, 15 Drawing Sheets

TRANSISTOR STRUCTURE FOR IMPROVED STATIC CONTROL DURING FORMATION OF THE TRANSISTOR

BACKGROUND OF THE INVENTION

1. Field of the Invention

The present invention relates to the formation of transistors via shadow mask vapor deposition events and, more particularly, to the formation of a transistor via shadow mask vapor deposition events in a manner that avoids damage to the semiconductor material of the transistor due to the undesirable discharge of static electricity that accumulates on a shadow mask during a shadow mask vapor deposition event.

2. Description of Related Art

Active matrix backplanes are widely used in flat panel displays, such as LCDs, for routing signals to pixels of the display in order to produce viewable pictures. Presently, such active matrix backplanes are formed by use of a photolithography manufacturing process, which has been driven in the market by the demand for higher and higher resolution displays which are not otherwise possible with other manufacturing processes. Photolithography is a pattern definition technique that uses electromagnetic radiation, such as ultraviolet (UV) radiation, to expose a layer of resist that is deposited on the surface of a substrate. Exemplary photolithography processing steps to produce an active matrix backplane include coat photoresist, pre-bake, soak, bake, align/expose, develop, rinse, bake, deposit layer, lift off photoresist, scrub/rinse and dry. As can be seen, the active matrix backplane fabrication process includes numerous deposition and etching steps in order to define appropriate patterns of the backplane. Because of the number of steps required to form an active matrix backplane by use of the photolithography manufacturing process, foundries of adequate capacity for volume production of backplanes are very expensive.

A shadow mask vapor deposition process is well known and has been used for years in microelectronics manufacturing. The shadow mask deposition process is a significantly less costly and less complex manufacturing process, compared to the photolithography process.

A problem of using the shadow mask vapor deposition process to form an active matrix backplane is that during one or more of the vapor deposition steps or events of said process a shadow mask placed in intimate contact with the source metal and/or the drain metal of one or more transistors of said backplane can accumulate a charge of static electricity, which accumulated charge can discharge and damage semiconductor material of said one or more transistors when the shadow mask is moved away from intimate contact with the source metal and/or the drain metal.

SUMMARY OF THE INVENTION

The invention is a shadow mask vapor deposition method. The method includes: (a) shadow mask vapor depositing a semiconductor segment; (b) shadow mask vapor depositing an electrically conductive drain contact on a first part of the semiconductor segment; (c) shadow mask vapor depositing a first insulator on the drain contact; (d) shadow mask vapor depositing an electrically conductive source contact on a second part of the semiconductor segment spaced from the drain contact; (e) shadow mask vapor depositing a second insulator on the source contact; (f) shadow mask vapor depositing a third insulator over at least part of each of the first and second insulators and the semiconductor segment between the drain contact and the source contact; and (g) shadow mask vapor depositing an electrically conductive gate contact on the third insulator and in spaced relation to the semiconductor segment between the drain contact and the source contact.

Steps (b) and (c) can be performed in the same deposition vacuum vessel utilizing the same shadow mask. Also or alternatively, steps (d) and (e) can be performed in the same deposition vacuum vessel utilizing the same shadow mask. Also or alternatively, steps (a)-(g) can each be performed in a different deposition vacuum vessel utilizing a different shadow mask.

The first insulator, the second insulator, or both can contact at least one shadow mask during at least one shadow mask vapor deposition event.

The semiconductor segment can be deposited on a substrate. Alternatively, the semiconductor segment can be deposited on a shadow mask vapor deposited fourth insulator which can be shadow mask vapor deposited on another electrically conductive gate contact which can be shadow mask vapor deposited on the substrate.

The drain contact, the source contact, or both can be made from layers of different conductive materials that have been separately shadow mask vapor deposited.

The invention is also a shadow mask vapor deposited structure comprising: a vapor deposited semiconductor segment; a vapor deposited electrically conductive drain contact on a first part of the semiconductor segment; a vapor deposited first insulator on the drain contact; a vapor deposited electrically conductive source contact on a second part of the semiconductor segment spaced from the drain contact; a vapor deposited second insulator on the source contact; a vapor deposited third insulator over at least part of each of the first and second insulators and the semiconductor segment between the drain contact and the source contact; and a vapor deposited electrically conductive gate contact on the third insulator in spaced relation to the semiconductor segment between the drain contact and the source contact.

The semiconductor segment is supported by a substrate. The structure can further include another electrically conductive gate contact on the substrate and a fourth insulator between the semiconductor segment and the other electrically conductive gate contact.

The drain contact, the source contact, or both can be made from layers of different conductive materials, such as a first layer of gold and a second layer of nickel.

BRIEF DESCRIPTION OF THE DRAWINGS

FIGS. 5A through 5I are plan views of exemplary successive depositions of the various segments that form the sub-pixels of FIG. 4;

DETAILED DESCRIPTION OF THE INVENTION

The present invention will be described with reference to the accompanying figures where like reference numbers correspond to like elements.

Figure 1A:
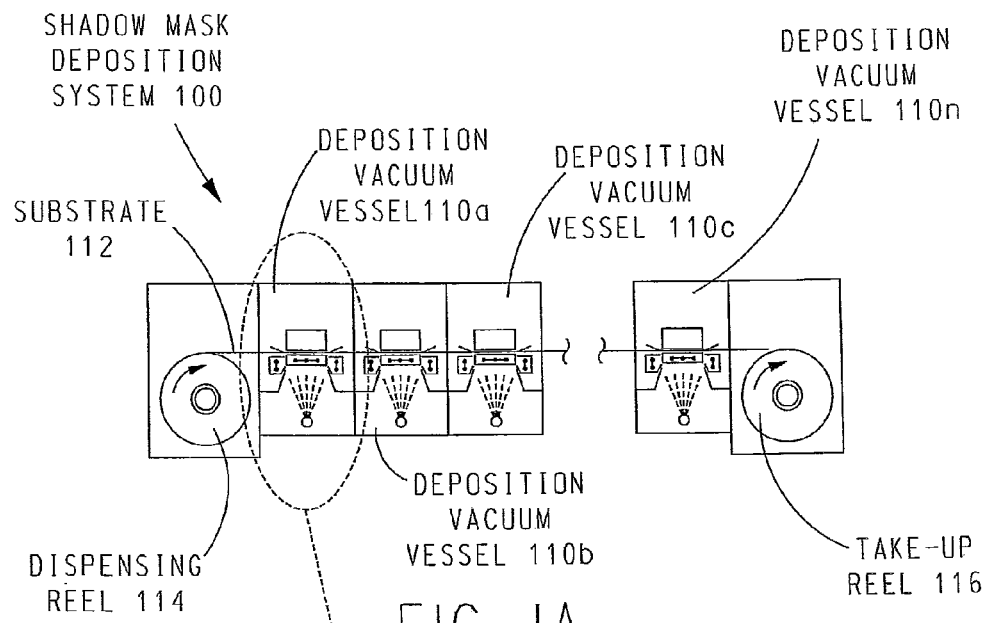
FIG. 1A is a diagrammatic illustration of a shadow mask deposition system for forming pixel structures of a high resolution active matrix LCD.
Figure 1B:
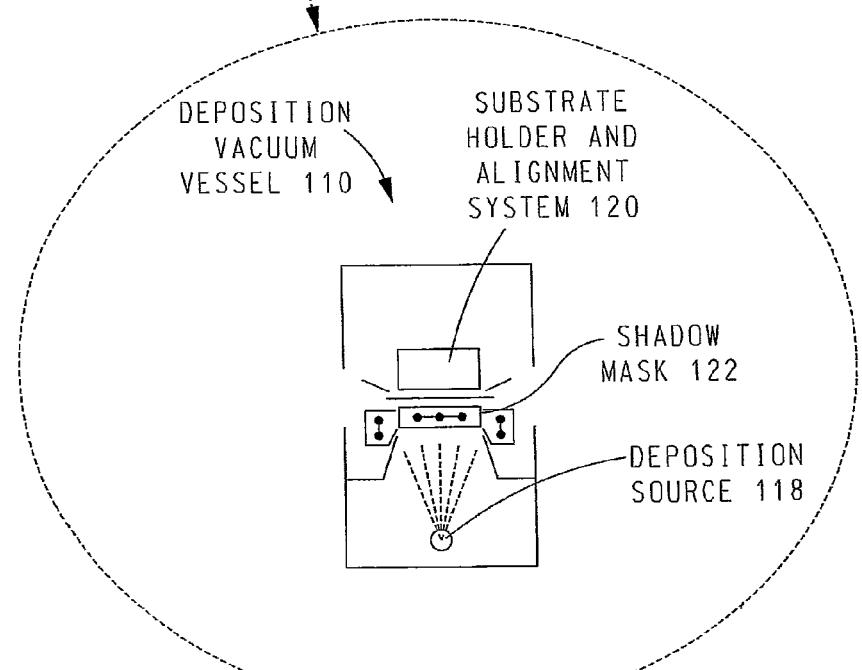
FIG. 1B is an enlarged view of a single deposition vacuum vessel of the shadow mask deposition system of FIG. 1A.

With reference to FIGS. 1A and 1B, a shadow mask deposition system 100 for forming LCD pixels of a high resolution active matrix LCD includes a plurality of deposition vacuum vessels 110 (e.g., deposition vacuum vessels 110a through 110n). The number and arrangement of deposition vacuum vessels 110 is dependent on the number of deposition events and etching events required for any given product formed therewith.

In use of shadow mask deposition system 100, a substrate 112 translates through the serially arranged deposition vacuum vessels 110 by use of a reel-to-reel mechanism that includes a dispensing reel 114 and a take-up reel 116.

Each deposition vacuum vessel 110 includes a deposition source 118, a substrate holder and alignment system 120 and a shadow mask 122. For example, deposition vacuum vessel 110a includes deposition source 118a, substrate holder and alignment system 120a and shadow mask 122a; deposition vacuum vessel 110b includes deposition source 118b, substrate holder and alignment system 120b and shadow mask 122b; deposition vacuum vessel 110c includes deposition source 118c, substrate holder and alignment system 120c and shadow mask 122c; and so forth, for any number of deposition vacuum vessels 110.

Deposition vacuum vessels 110 are arranged and connected in series. Each deposition source 118 is charged with a desired material to be deposited onto flexible substrate 112 through its associated shadow mask 122 which is held in intimate contact with the portion of substrate 112 in the corresponding deposition vacuum vessel 110.

An exemplary substrate holder and alignment system 120 is disclosed in U.S. patent application Ser. No. 10/971,218, filed Oct. 22, 2004, entitled, "Substrate-To-Mask Alignment And Securing System With Temperature Control For Use In An Automated Shadow Mask Vacuum Deposition Process" which is incorporated herein by reference (hereinafter "the '218 application). The '218 application discloses a substrate holder and alignment system 120 that includes a substrate arranged between a magnetic chuck assembly and a mask holder assembly. The magnetic chuck assembly includes a magnetic chuck, a thermoelectric device, a plurality of thermal sensors and a plurality of light sources. Substrate holder and alignment system 120 further includes a mask holder for holding a shadow mask 122, a motion control system and an optical alignment system. The ability to accurately align each shadow mask 122 to substrate 112 using substrate holder and alignment system 120 during each successive deposition event allows the formation of LCD pixel structures on a suitably small pitch to achieve a high resolution active matrix LCD in the manner described in greater detail hereinafter.

Each shadow mask 122 in shadow mask deposition system 100 includes a pattern of apertures (not shown), e.g., slots and holes. The pattern of apertures formed in each shadow mask 122 corresponds to a desired pattern of material to be deposited on substrate 112 from a corresponding deposition source 118 in a corresponding deposition vacuum vessel 110 as substrate 112 advances through shadow mask deposition system 100.

Each shadow mask 122 is formed of, for example, nickel, chromium, steel, copper, Kovar® or Invar®, and has a thickness of, for example, 150-200 microns. Kovar® and Invar® can be obtained from, for example, ESPICorp Inc. of Ashland, Oreg. In the United States, Kovar® is a registered trademark, Registration No. 337,962, currently owned by CRS Holdings, Inc. of Wilmington, Del., and Invar® is a registered trademark, Registration No. 63,970, currently owned by Imphy S.A. Corporation of France.

Those skilled in the art will appreciate that production system 100 may include additional stages (not shown), such as an anneal stage, a test stage, one or more cleaning stages, a cut and mount stage, and the like, as is well known. In addition, the number, purpose and arrangement of deposition vacuum vessels 110 can be modified, as needed, for depositing one or more materials required for a particular application by one of ordinary skill in the art. An exemplary production system 100 is disclosed in U.S. Patent Application Publication No. 2003/0228715, entitled "Active Matrix Backplane For Controlling Controlled Elements And Method Of Manufacture Thereof", which is incorporated herein by reference.

Deposition vacuum vessels 110 can be utilized for depositing materials on substrate 112 in order to form one or more electronic elements on substrate 112. Each electronic element may be, for example, a thin film transistor (TFT), a memory element or a capacitor. A multilayer circuit can be formed solely by successive depositions of materials on substrate 112 via successive deposition events in deposition vacuum vessels 110.

Each deposition vacuum vessel 110 is connected to a source of vacuum (not shown), that is operative for establishing a suitable vacuum therein in order to enable a charge of the desired material disposed in the corresponding deposition source 118 to be deposited on substrate 112 in a manner known in the art, e.g., sputtering or vapor phase deposition, through apertures in the corresponding shadow mask 122.

In the following description, substrate 112 is described as a continuous flexible sheet which is dispensed from dispensing reel 114, which is disposed in a pre-load vacuum vessel, into the first deposition vacuum vessel 110. However, this is not to be construed as limiting the invention since shadow mask deposition system 100 can be configured to continuously process a plurality of standalone or individual substrates 112. Each deposition vacuum vessel 110 can include supports or guides that avoid the sagging of substrate 112 as it is advanced therethrough.

In operation of shadow mask deposition system 100, the material disposed in each deposition source 118 is deposited on substrate 112 through a corresponding shadow mask 122 in the presence of a suitable vacuum as substrate 112 is advanced through the deposition vacuum vessel 110 by the action of dispensing reel 114 and take-up reel 116, whereupon plural progressive patterns are formed on substrate 112. More specifically, substrate 112 has plural portions, each of which is positioned for a predetermined interval in each deposition vacuum vessel 110. During this predetermined interval, material is deposited from the corresponding deposition source 118 onto the portion of substrate 112 that is positioned in the corresponding deposition vacuum vessel 110. After this predetermined interval, substrate 112 is step advanced so that the portion of substrate 112 is advanced to the next vacuum vessel in series for additional processing, as applicable. This step advancement continues until each portion of substrate 112 has passed through all deposition vacuum vessels 110.

Thereafter, each portion of substrate 112 exiting deposition vacuum vessel 110 is received on take-up reel 116, which is positioned in a storage vacuum vessel (not shown). Alternatively, each portion of substrate 112 exiting shadow mask deposition system 100 is separated from the remainder of substrate 112 by a cutter (not shown).

Figure 2:
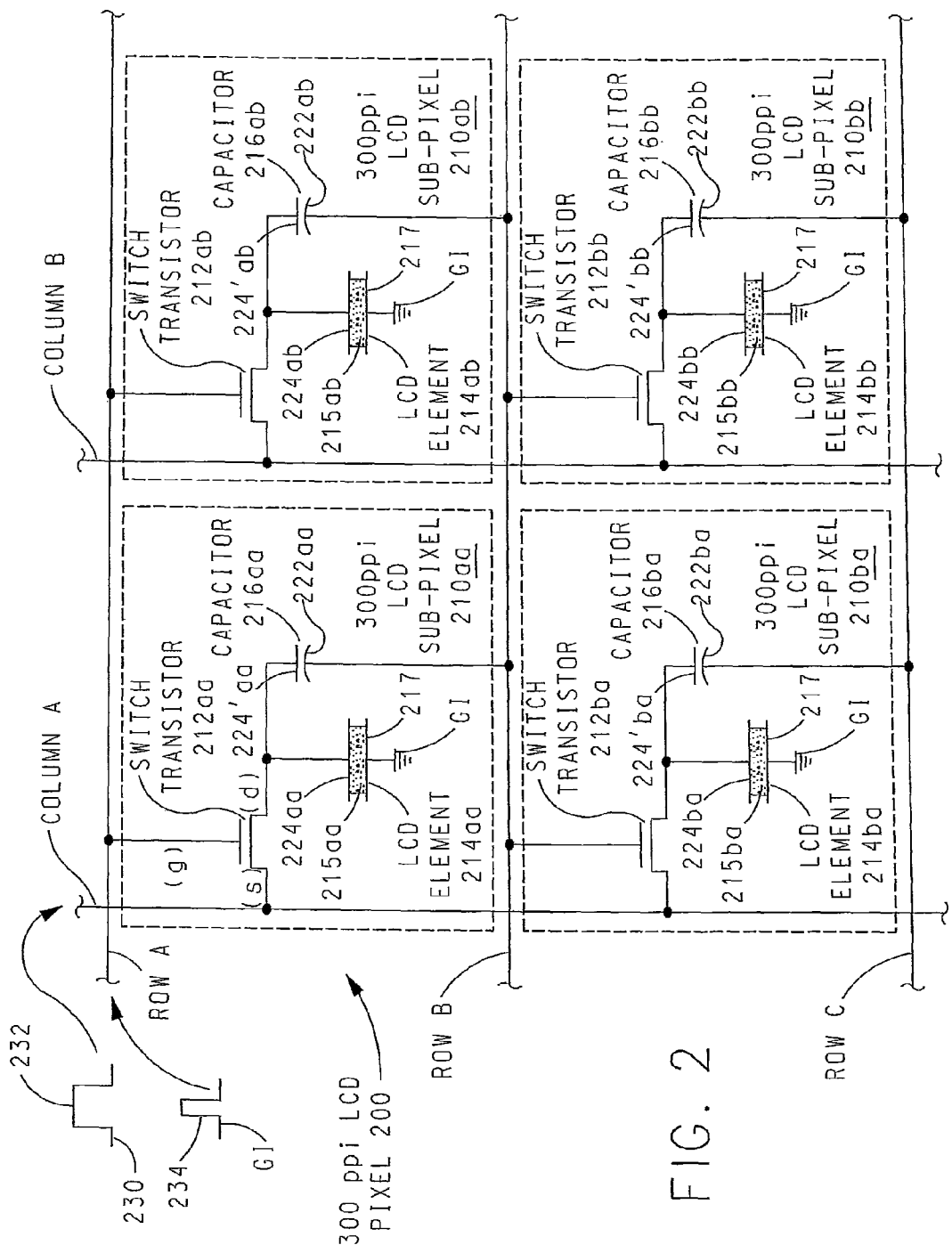
FIG. 2 is a circuit schematic of an exemplary 300 ppi LCD pixel formed of four sub-pixels by use of the shadow mask deposition system of FIG. 1A.

With reference to FIG. 2, an exemplary 300 ppi LCD pixel 200 that can be formed by shadow mask deposition system 100 comprises a 2×2 arrangement of sub-pixels 210, i.e., sub-pixels 210aa, 210ab, 210ba and 210bb. Sub-pixels 210aa, 210ab, 210ba and 210bb can be a RED sub-pixel, a first GREEN sub-pixel, a second GREEN sub-pixel and a BLUE sub-pixel, respectively. Alternatively, sub-pixels 210aa, 210ab, 210ba and 210bb can be a RED sub-pixel, a GREEN sub-pixel, a BLUE sub-pixel and a WHITE sub-pixel, respectively. Since LCD pixel 200 is representative of one of several identical pixels arranged in any user-defined array configuration for forming a complete active matrix LCD device, the description of LCD pixel 200 is not to be construed as limiting the invention.

Sub-pixels 210aa, 210ab, 210ba and 210bb are addressed via pulsed signals applied on a ROW A and a ROW B and via voltage levels applied on a COLUMN A and a COLUMN B. Each sub-pixel 210 comprises a switch transistor 212, such as, without limitation, a standard thin film transistor (TFT); an LCD element 214 formed of liquid crystal material 215 sandwiched between two transparent electrodes and a capacitor 216 which serves as a voltage storage element. In FIG. 2, sub-pixel 210aa includes switch transistor 212aa, LCD element 214aa including liquid crystal material 215aa and capacitor 216aa; sub-pixel 210ab includes switch transistor 212ab, LCD element 214ab including liquid crystal material 215ab and capacitor 216ab; sub-pixel 210ba includes switch transistor 212ba, LCD element 214ba including liquid crystal material 215ba and capacitor 216ba; and sub-pixel 210bb includes switch transistor 212bb, LCD element 214bb including liquid crystal material 215bb and capacitor 216bb.

The arrangement of the electrical components of each sub-pixel 210 will now be described with reference to sub-pixel 210aa. A control or gate terminal (g) of switch transistor 212aa is electrically connected to ROW A, a power or source terminal (s) of switch transistor 212aa is electrically connected to COLUMN A and a power or drain terminal (d) of switch transistor 212aa is electrically connected to a first electrode 224aa of LCD element 214aa and to a first electrode 224'aa of capacitor 216aa. A second electrode 217 of LCD element 214aa is connected to a reference voltage or ground G1. A second electrode 222aa of capacitor 216aa is connected to ROW B. The arrangement of the electrical components of sub-pixels 210aa, 210ab, 210ba and 210bb is identical, except for their connections to their respective ROWs and COLUMNs.

The operation of each sub-pixel 210 of pixel 200 will now be described with reference to sub-pixel 210aa. To activate LCD element 214aa, the voltage applied to COLUMN A is changed from a first voltage 230, e.g., zero volts, to a second voltage 232, e.g., ten volts. During the application of second voltage 232 to COLUMN A, a pulsed signal 234 is applied to ROW A and reference voltage G1 is applied to ROW B. Pulsed signal 234 causes switch transistor 212aa to conduct, whereupon, subject to a voltage drop across transistor 212aa, second voltage 232 impressed on COLUMN A is impressed on first electrode 224aa of LCD element 214aa via drain terminal (d) of switch transistor 212aa thereby activating LCD element 214aa. Because capacitor 216aa is connected between drain terminal (d) of switch transistor 212aa and ROW B, when pulsed signal 234 is applied to ROW A, capacitor 216aa charges to the voltage impressed on COLUMN A, i.e., second voltage 232, minus any voltage drop across switch transistor 212aa.

Upon termination of pulsed signal 234 on ROW A, capacitor 216aa stores the voltage received from COLUMN A. Thereafter, capacitor 216aa impresses its stored voltage on the first electrode 224aa of LCD element 214aa, whereupon LCD element 214aa is held in an active, light emitting state in the absence of pulsed signal 234 on ROW A. Conversely, LCD element 214aa is turned off when pulsed signal 234 is applied on ROW A in the presence of first voltage 230, e.g., zero volts, on COLUMN A. More specifically, applying pulsed signal 234 to ROW A when first voltage 230 is applied to COLUMN A causes switch transistor 212aa to turn on, whereupon capacitor 216aa discharges through switch transistor 212aa thereby deactivating LCD element 214aa. Upon termination of pulsed signal 234, capacitor 216aa is charged to the voltage impressed on COLUMN A, i.e., first voltage 230, plus any voltage drop across switch transistor 212aa, whereupon LCD element 214aa is held in its inactive state even after pulsed signal 234 on ROW A is terminated and switch transistor 212aa is switched off thereby isolating LCD element 214aa and capacitor 216aa from ROW A.

In a like manner, LCD element 214ab can be turned on and off in response to the application of pulsed signal 234 on ROW A when second voltage 232 and first voltage 230, respectively, are applied to COLUMN B and reference voltage G1 is applied to ROW B; LCD element 214ba can be turned on and off in response to the application of pulsed signal 234 on ROW B when second voltage 232 and first voltage 230, respectively, are applied to COLUMN A and reference voltage G1 is applied to ROW C; and LCD element 214bb can be turned on and off in response to the application of pulsed signal 234 on ROW B when second voltage 232 and first voltage 230, respectively, are applied to COLUMN B and reference voltage G1 is applied to ROW C. In practice, each of ROW A, ROW B, ROW C, etc., is held at reference voltage G1 in the absence of pulsed signal 234 being applied thereto. Similarly, each of COLUMN A, COLUMN B, etc., is held at first voltage 230, e.g., zero volts, in the absence of the application of second voltage 232, e.g., ten volts, thereto.

Figure 3:
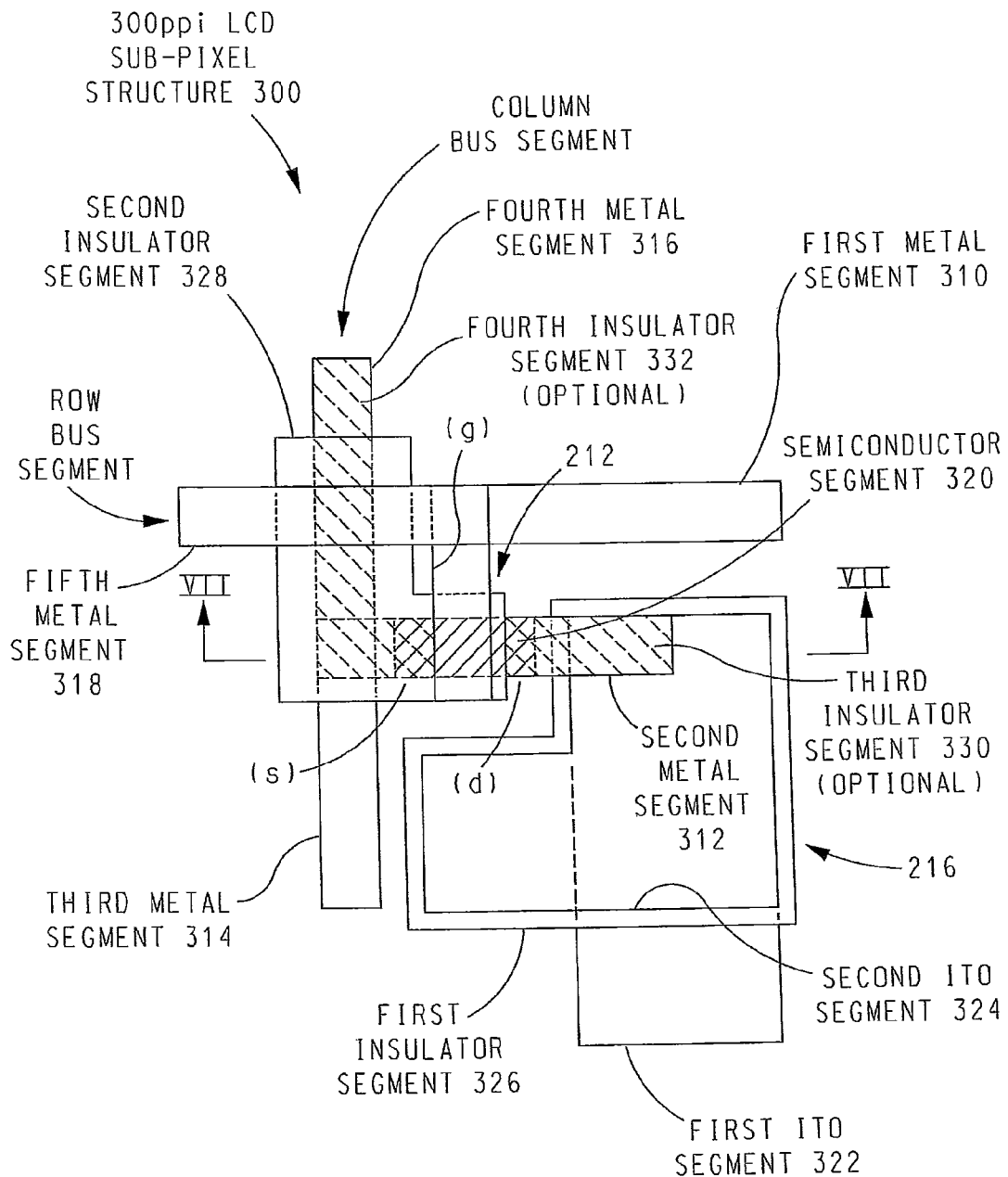
FIG. 3 is a plan view of an exemplary physical layout of one of the sub-pixels of FIG. 2.

With reference to FIG. 3 and with continuing reference to FIG. 2, a sub-pixel structure 300 representative of the physical structure that forms each sub-pixel 210 of pixel 200 includes an elongated first metal segment 310, an elongated second metal segment 312, an elongated third metal segment 314, an L-shaped fourth metal segment 316, an L-shaped fifth metal segment 318, an elongated semiconductor segment 320, an elongated first indium-tin oxide (ITO) segment 322, an L-shaped second ITO segment 324, an L-shaped first insulator segment 326 and an L-shaped second insulator segment 328.

Metal segments 310, 312, 314, 316 and 318 are formed of any electrically conductive material that is depositable via a shadow mask deposition process, such as, without limitation, molybdenum (Mo), copper (Cu), nickel (Ni), chromium (Cr) or aluminum (Al). Semiconductor segment 320 is formed of a semiconductor material that is depositable via a shadow mask deposition process and which is suitable for forming a thin-film-transistor (TFT) by vacuum evaporation, such as, without limitation, cadmium selenide (CdSe), cadmium sulfide (CdS) or tellurium (Te). ITO segments 322 and 324 are formed of indium-tin-oxide (ITO), which is a transparent, electrically conductive material depositable via a shadow mask deposition process. Insulator segments 326 and 328 are formed of any transparent, electrically non-conductive material that is depositable via a shadow mask deposition process, such as, without limitation, aluminum oxide ($Al_2O_3$) or silicon dioxide ($SiO_2$).

Semiconductor segment 320 is the current-carrying layer of switch transistor 212. The combination of fifth metal segment 318 overlapping first metal segment 310 in the manner shown in FIG. 3 fauns a ROW bus segment and forms the gate terminal (g) of switch transistor 212. The combination of fourth metal segment 316 overlapping third metal segment 314 in the manner shown in FIG. 3 forms a COLUMN bus segment and forms the source terminal (s) of switch transistor 212. Second metal segment 312 forms the drain terminal (d) of switch transistor 212 and forms a contact with second ITO segment 324 which functions as both the first electrode 224 of LCD element 214 and the first electrode 224' of capacitor 216. First ITO segment 322 functions as second electrode 222 of capacitor 216 which is connected to the next successive ROW bus. First insulator segment 326 electrically isolates first ITO segment 322 from second ITO segment 324 thereby functioning as the dielectric of capacitor 216. Second insulator segment 328 electrically isolates the combination of first metal segment 310 and fifth metal segment 318 from the combination of third metal segment 314 and fourth metal segment 316 thereby electrically isolating the ROW bus segment from the COLUMN bus segment. Second insulator segment 328 also serves as the gate dielectric of switch transistor 212.

Desirably, each segment 310-328 of each sub-pixel structure 300 is formed on a transparent substrate (not shown), such as, without limitation, a glass substrate or a color filter of the type typically used to fowl red, green and blue pixel regions in a liquid crystal display. Each segment of each sub-pixel structure 300 is formed by a shadow mask deposition process in a shadow mask deposition system, like shadow mask deposition system 100.

An LCD is a display device that includes an electrically-controlled, light-polarizing liquid, such as liquid crystal material 215, that is trapped in cells between two transparent polarizing sheets positioned in spaced parallel relation. Each cell includes at least one electrical contact on each polarizing sheet for facilitating the application of an electric potential to the light-polarizing liquid inside. The formation of a functioning LCD pixel 200 can be completed by the placement of liquid crystal material 215 atop each sub-pixel structure 300 of LCD pixel 200 and, subsequently, the placement of one continuous film of ITO atop liquid crystal material 215, whereupon the liquid crystal material is sandwiched between the continuous film of ITO (which may serve as a ground plane) and each sub-pixel structure 300. The continuous film of ITO functions as the opposite electrode of each LCD element 214 with respect to the corresponding second ITO segment 324. The continuous film of ITO is represented in LCD pixel 200 of FIG. 2 by the reference number 217 associated with the second electrode 217 of each LCD element 214. When a suitable electrical potential is applied between a second ITO segment 324 and the continuous film of ITO, liquid crystal 215 material therebetween is activated.

Figure 4:
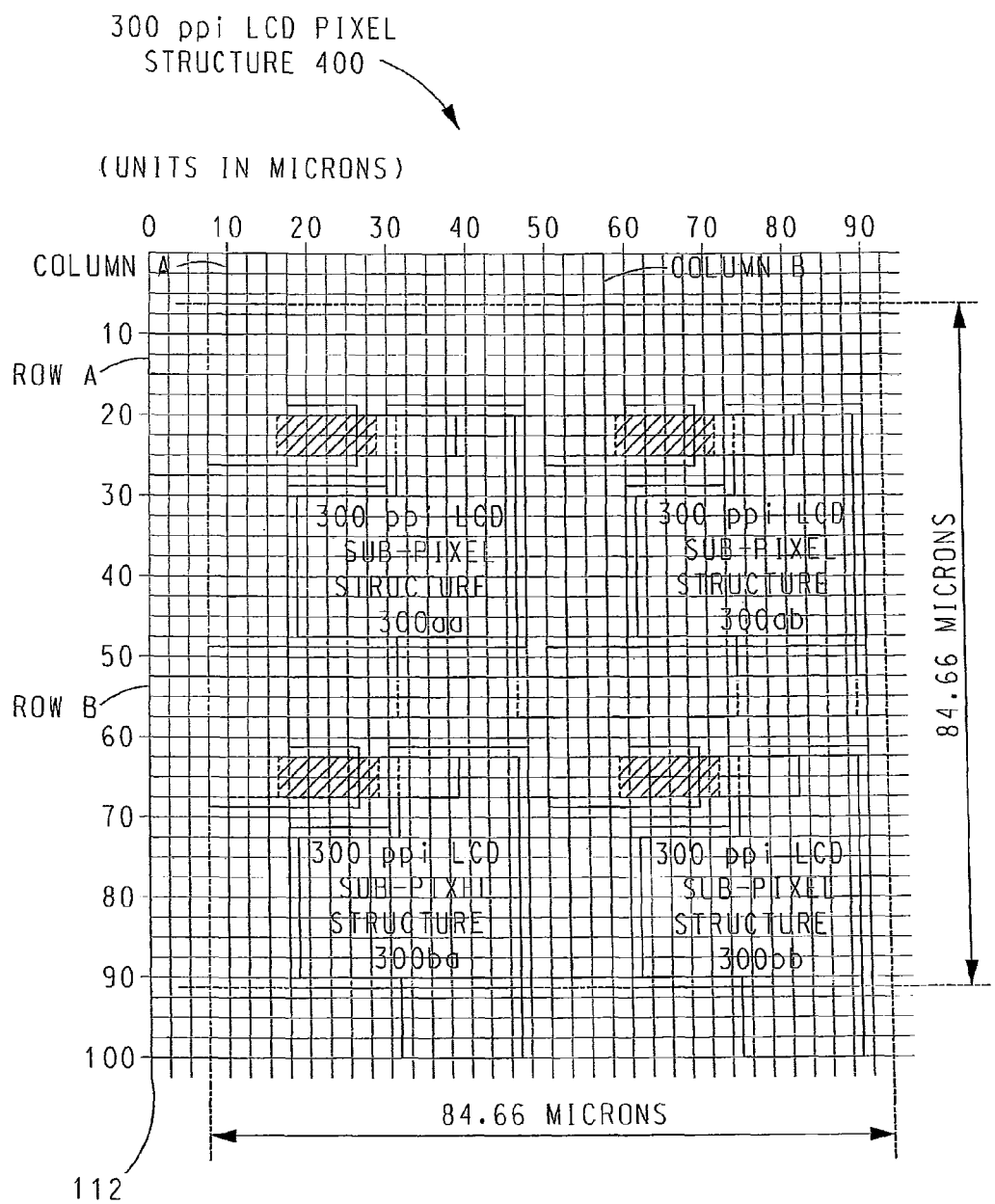
FIG. 4 is a plan view of an exemplary physical layout of the sub-pixels that form the LCD pixel of FIG. 2.

With reference to FIG. 4 and with continuing reference to FIGS. 1-3, a physical implementation of a 300 ppi LCD pixel structure 400 corresponding to the circuit schematic of 300 ppi LCD pixel structure 200 shown in FIG. 2, includes a 2×2 array of sub-pixel structures 300, i.e., sub-pixel structures 300aa, 300ab, 300ba and 300bb.

Pixel structure 400 is shown upon substrate 112. In FIG. 4, substrate 112 includes a grid which is shown only to indicate the general geometry, dimensions and relative placement of the individual segments of the 2×2 array of sub-pixel structures 300. Accordingly, the grid on substrate 112 in FIG. 4 is not to be construed as limiting the invention.

In one exemplary embodiment, the overall dimension of pixel structure 400 is 84.66×84.66 microns and the overall dimension of each sub-pixel structure 300 is 42.33×42.33 microns. The geometry, dimensions and relative placement of the individual segments of each sub-pixel structure 300 is not limited to that shown in FIG. 4 and, subsequently, shown in FIGS. 5A-5I so long as the spacing from one pixel structure 400 to the next in both the X and Y directions does not exceed 84.66 microns. The foregoing dimensions of pixel structure 400 and sub-pixel structures 300, however, are exemplary only and are not to be construed as limiting the invention.

An exemplary, non-limiting sequence of depositions to form LCD pixel structure 400 will now be described with reference to FIGS. 5A-5I.

Figure 5A:
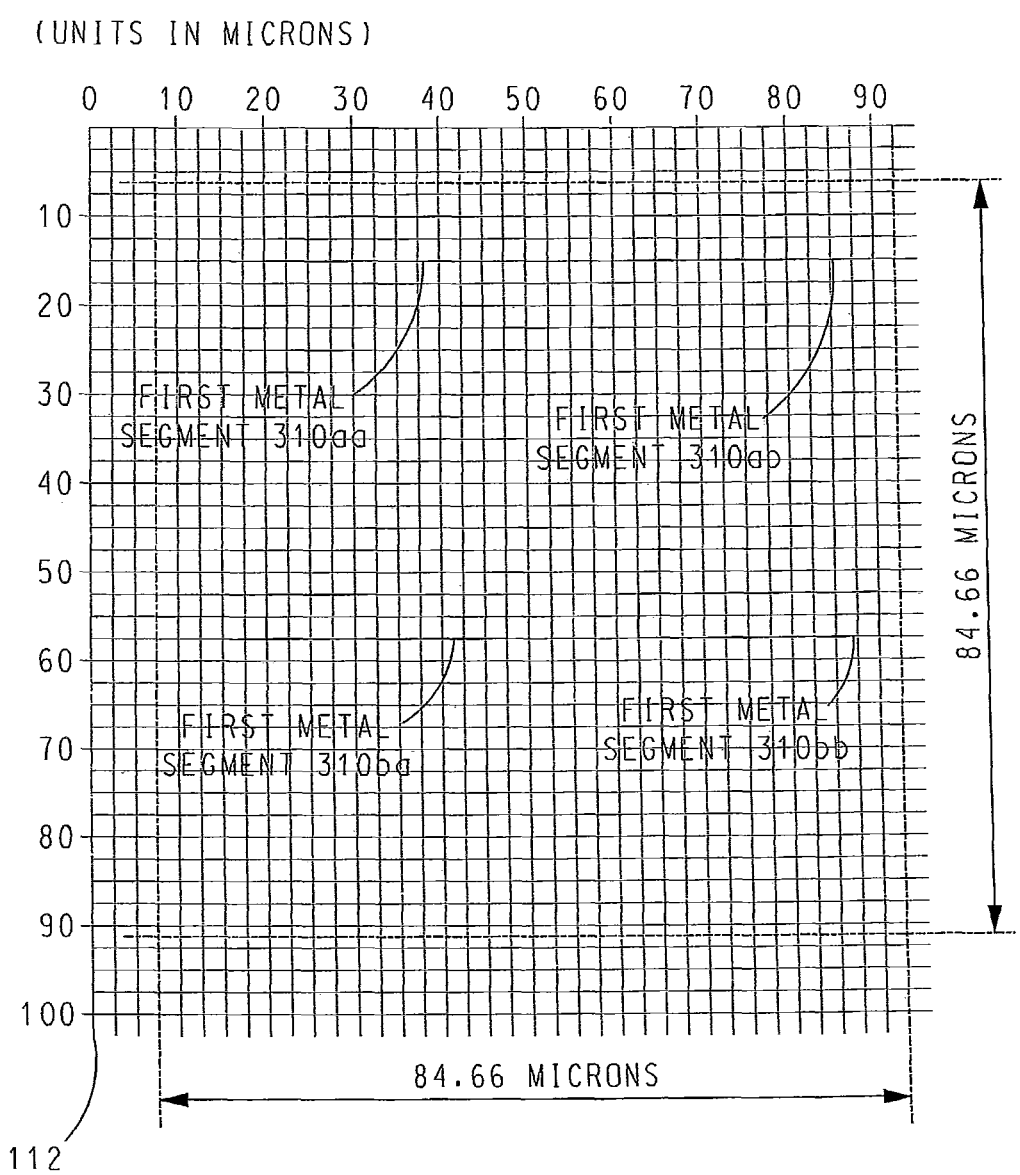

With reference to FIG. 5A and with continuing reference to all previous Figs., first metal segments 310aa, 310ab, 310ba and 310bb are initially deposited on substrate 112 in shadow mask deposition system 100 by way of a shadow mask having a pattern of apertures of the same geometry, dimensions and spacing as said first metal segments.

Figure 5B:
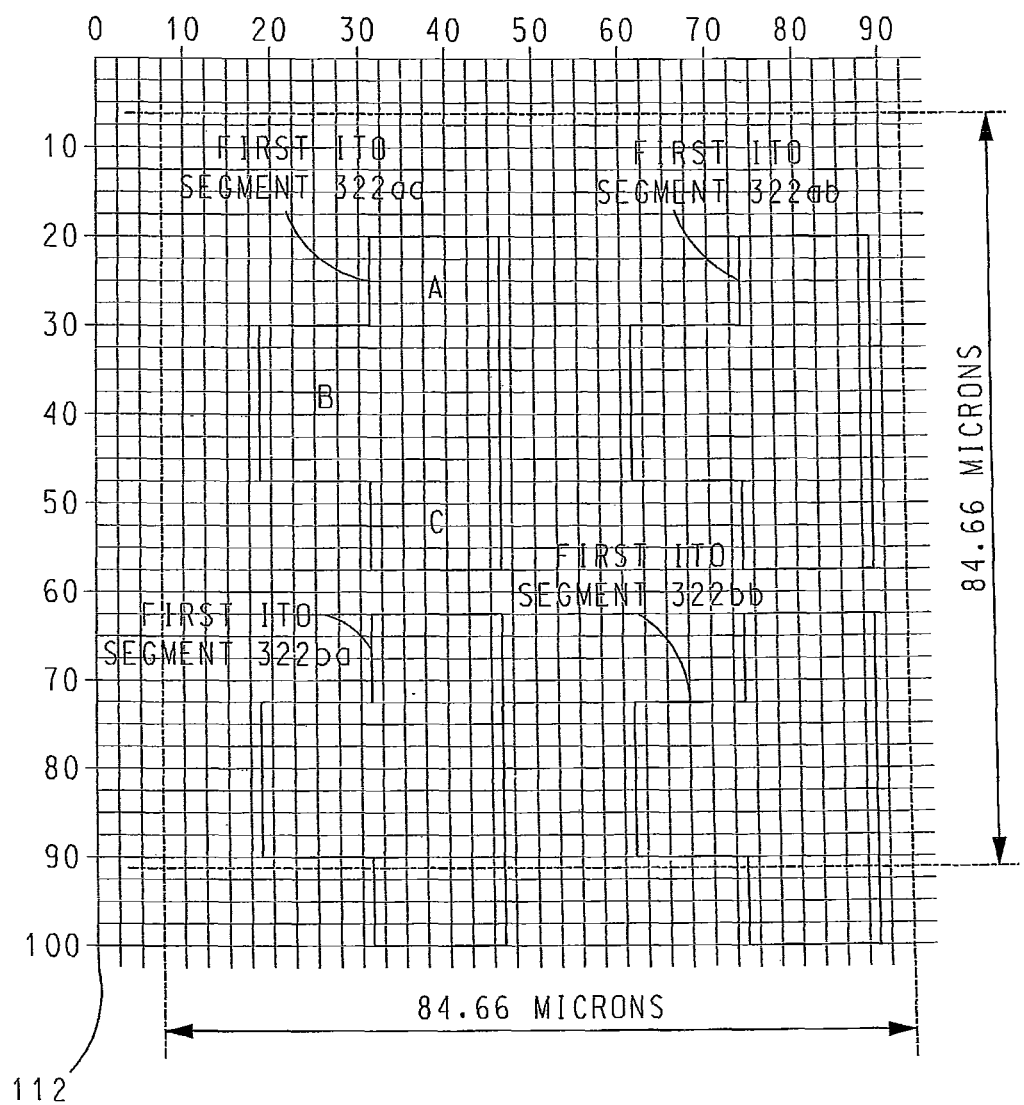

With reference to FIG. 5B and with continuing reference to all previous Figs., next first ITO segments 322aa, 322ab, 322ba and 322bb are deposited on substrate 112 in shadow mask deposition system 100 by way of a shadow mask having a pattern of apertures of the same geometry, dimensions and spacing as said first ITO segments.

Figure 5C:
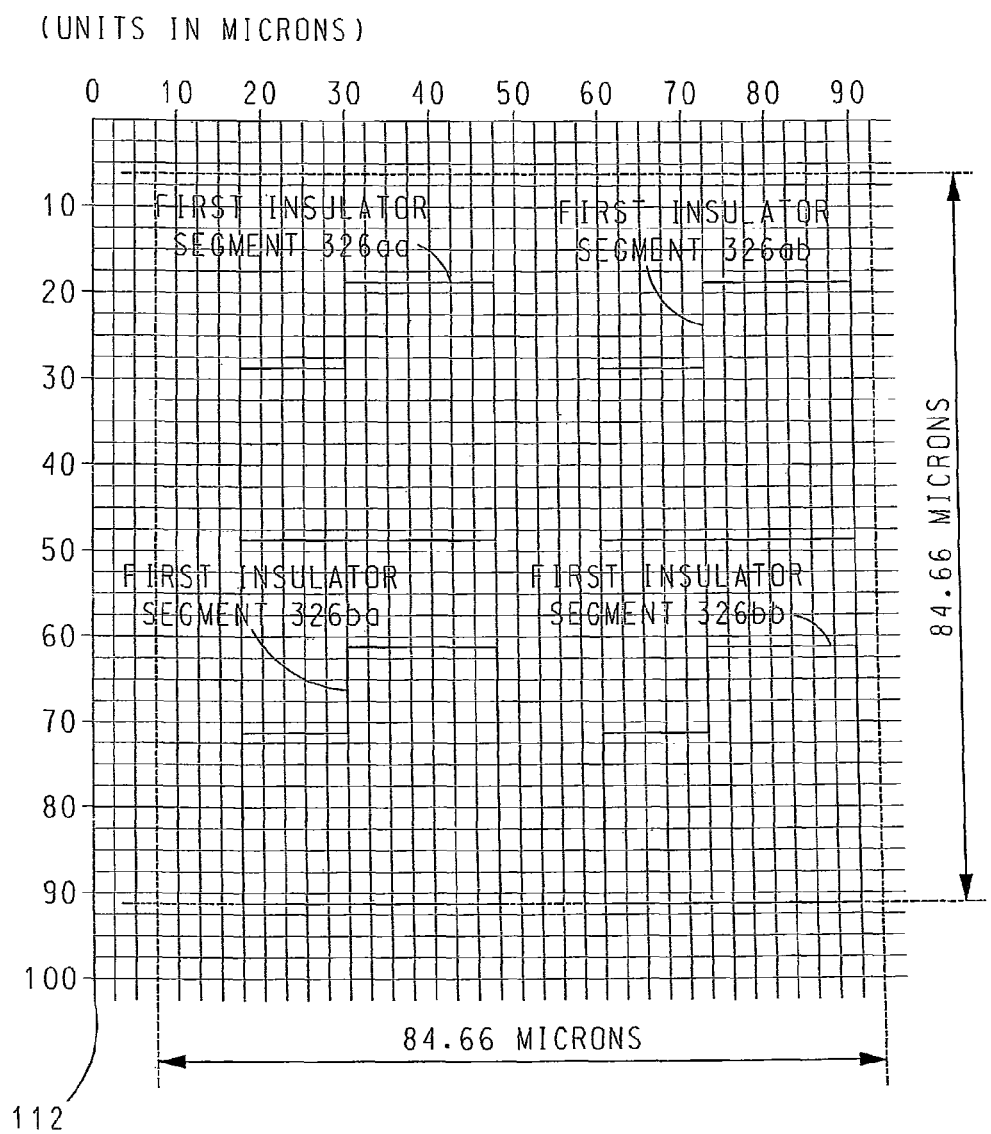

With reference FIG. 5C and with continuing reference to all previous Figs., next first insulator segments 326aa, 326ab, 326ba and 326bb are deposited on substrate 112 in shadow mask deposition system 100 by way of a shadow mask having a pattern of apertures of the same geometry, dimensions and spacing as said first insulator segments.

Comparing FIGS. 5B and 5C, it can be seen that first insulator segments 326aa, 326ab, 326ba and 326bb are deposited atop first ITO segments 322aa, 322ab, 322ba and 322bb. More specifically, each first insulator segment 326 completely covers portions A and B of the corresponding first ITO segment 322. However, segment C of each first ITO segment 322 is not covered by the corresponding first insulator segment 326.

Figure 5D:
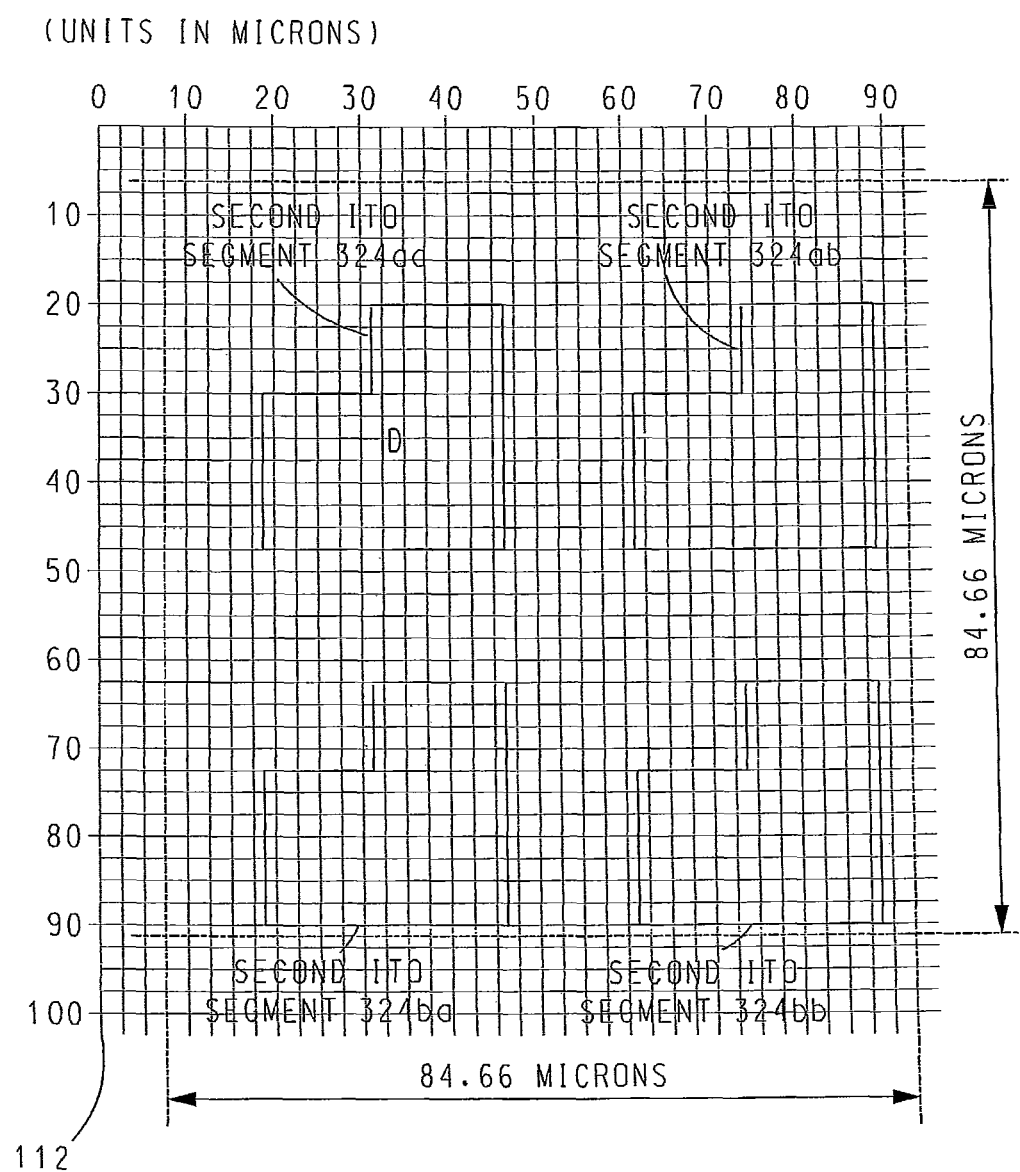

With reference to FIG. 5D and with continuing reference to all previous Figs., next, second ITO segments 324aa, 324ab, 324ba and 324bb are deposited on substrate 112 in shadow mask deposition system 100 by way of a shadow mask having a pattern of apertures of the same geometry, dimensions and spacing as said second ITO segments.

Comparing FIGS. 5C and 5D, it can be seen that each second ITO segment 324 is deposited atop of the corresponding first insulator segment 326 such that a portion of each first insulator segment 326 extends from beneath and around the periphery of the corresponding second ITO segment 324.

Figure 5E:
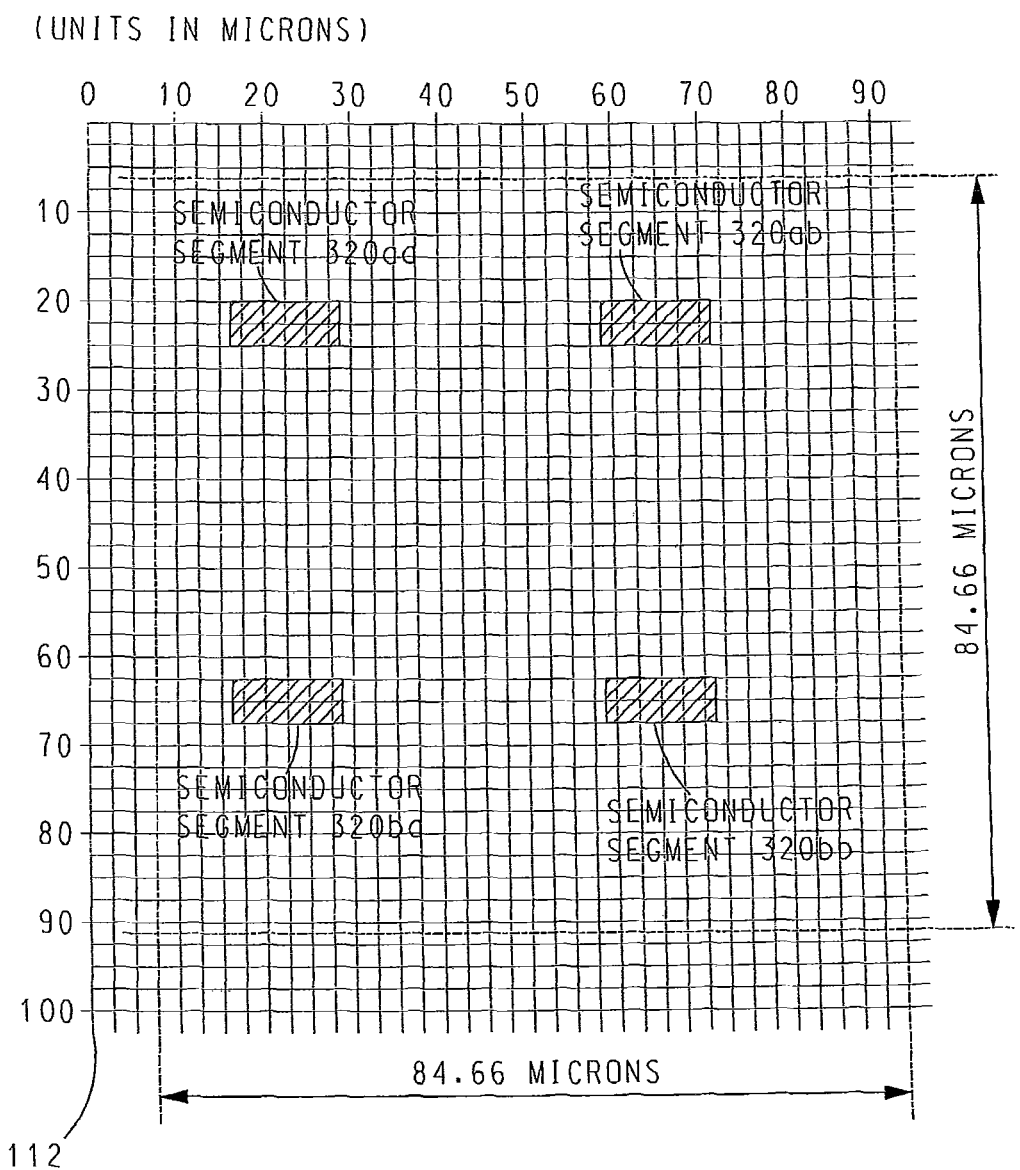

With reference to FIG. 5E and with continuing reference to all previous Figs., next, semiconductor segments 320aa, 320ab, 320ba and 320bb are deposited on substrate 112 in shadow mask deposition system 100 by way of a shadow mask having a pattern of apertures of the same geometry, dimensions and spacing as said semiconductor segments. More specifically, each semiconductor segment 320 is deposited between a previously deposited first metal segment 310 and a corner D of a corresponding second ITO segment 324.

Figure 5F:
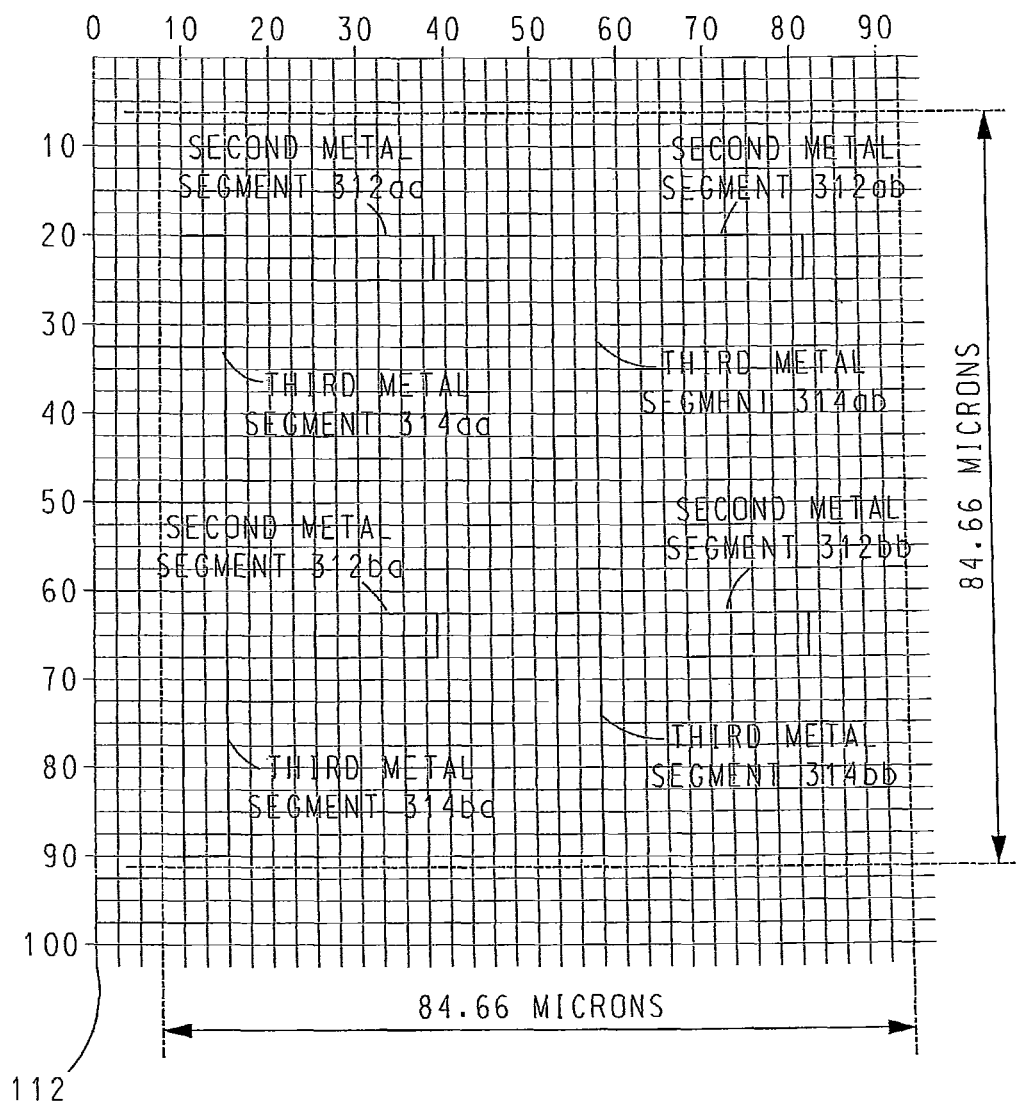

With reference to FIG. 5F and with continuing reference to all previous Figs., next, second metal segments 312aa, 312ab, 312ba and 312bb along with third metal segments 314aa, 314ab, 314ba and 314bb are deposited on substrate 112 in shadow mask deposition system 100 by way of a shadow mask having a pattern of apertures of the same geometry, dimensions and spacing as said second and third metal segments. Each second metal segment 312 is deposited overlapping the corresponding semiconductor segment 320 and the corresponding second ITO segment 324. Each third metal segment 314 is deposited adjacent a corresponding semiconductor segment 320 and second ITO segment 324.

Figure 5G:
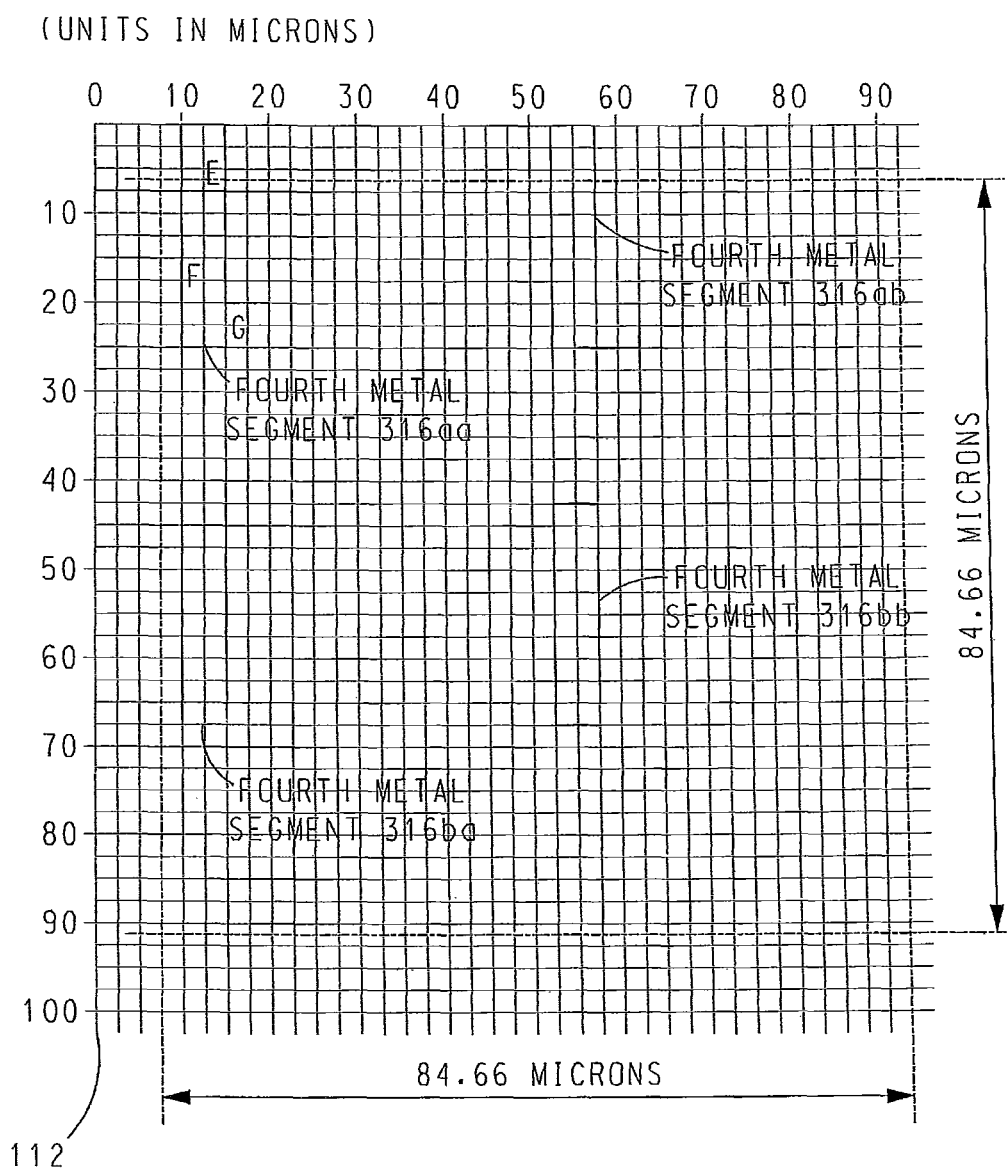

With reference to FIG. 5G and with continuing reference to all previous Figs., next, fourth metal segments 316aa, 316ab, 316ba and 316bb are deposited on substrate 112 in shadow mask deposition system 100 by way of a shadow mask having a pattern of apertures of the same geometry, dimensions and spacing as said fourth metal segments. Each fourth metal segment 316 is deposited overlapping a corresponding third metal segment 314 and a corresponding semiconductor segment 320.

Figure 5H:
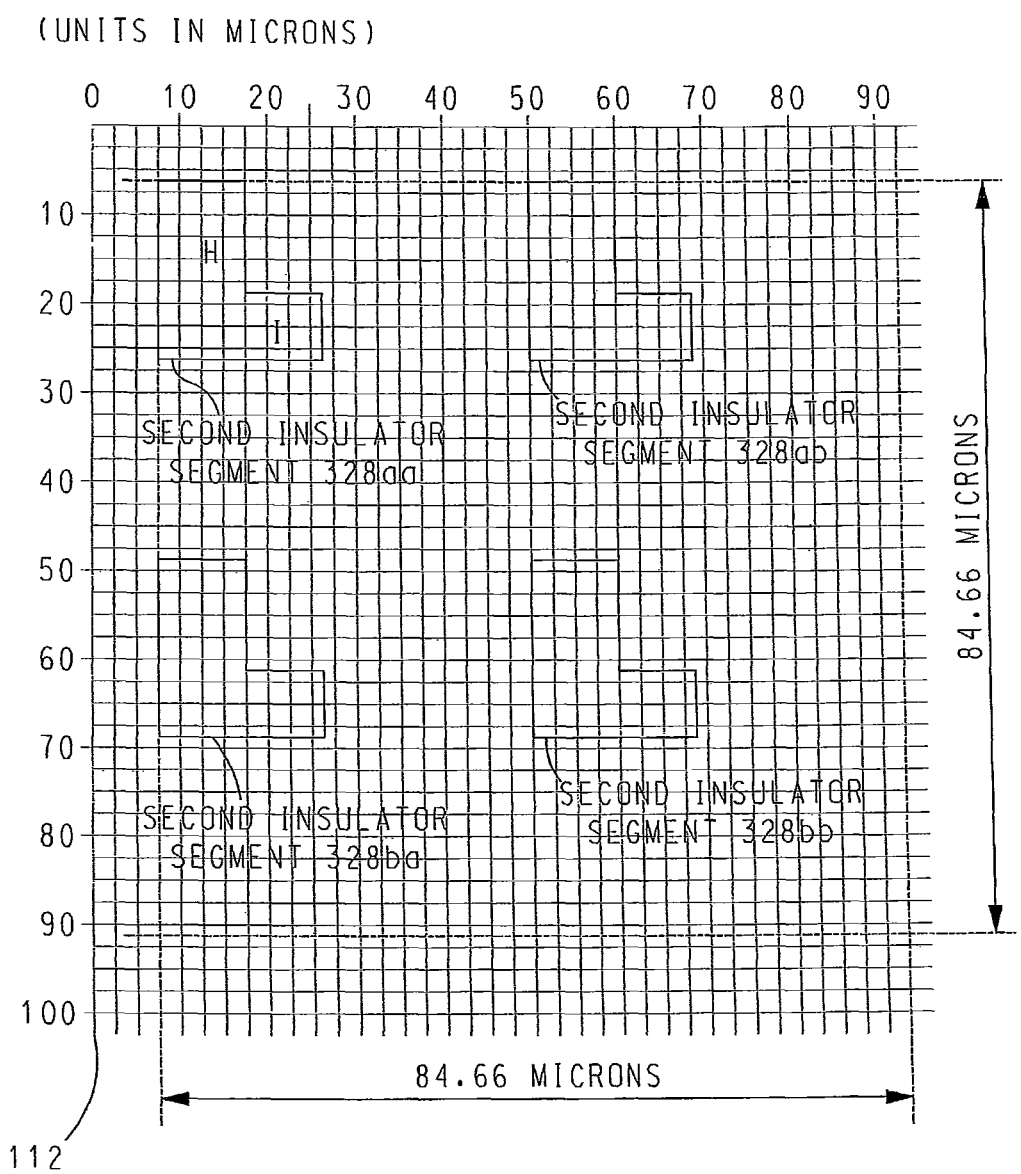
Figure 51:
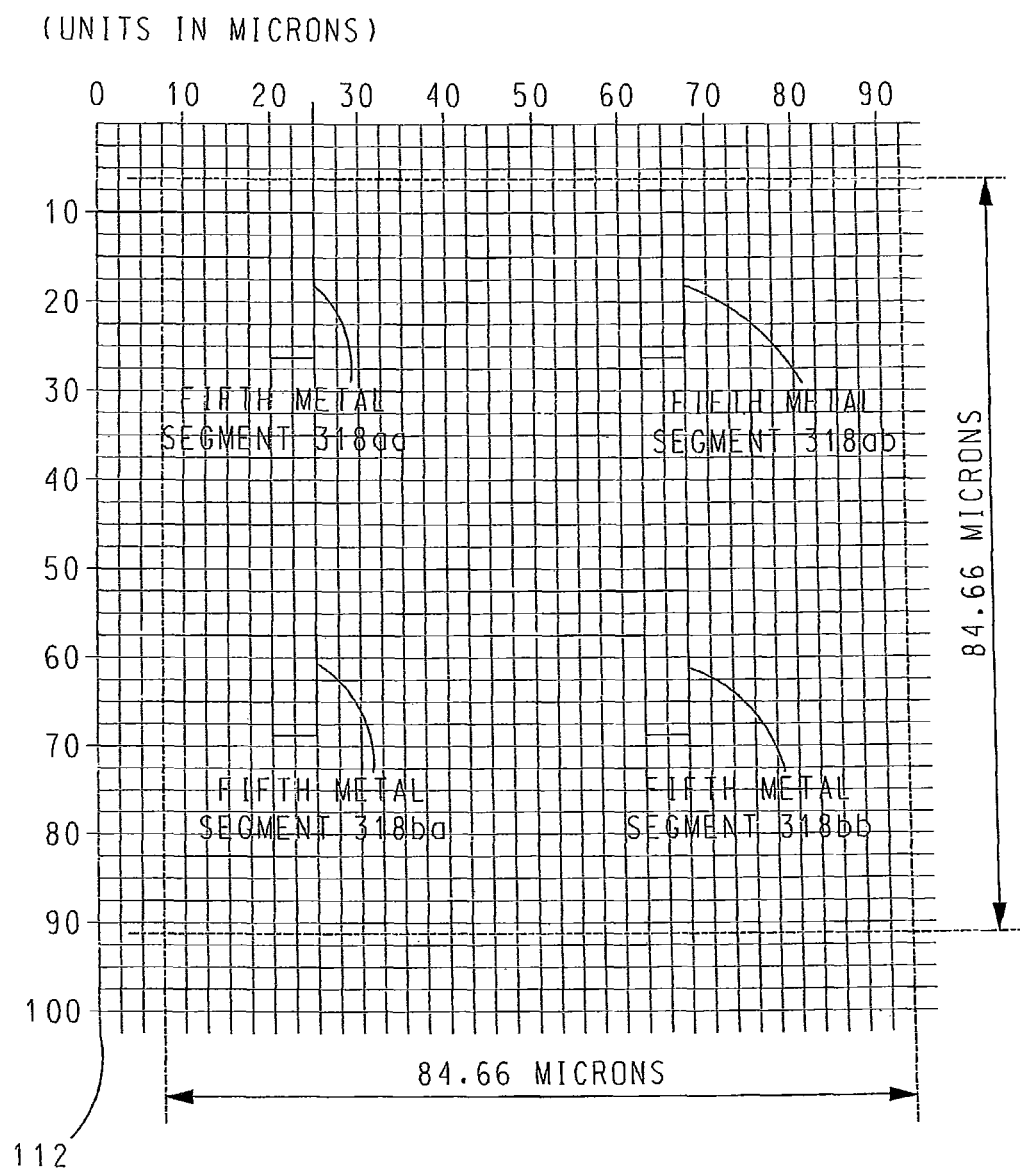

With reference to FIG. 5H and with continuing reference to all previous Figs., next, second insulator segments 328aa, 328ab, 328ba and 328bb are deposited on substrate 112 in shadow mask deposition system 100 by way of a shadow mask having a pattern of apertures of the same geometry, dimensions and spacing as said second insulator segments. Each second insulator segment 328 is deposited such that portion E of the corresponding fourth metal segment 316 is not covered thereby, while portions F and G of the corresponding fourth metal segment 316, along with a majority of the corresponding semiconductor segment 320 opposite second metal segment 312, are covered.

Lastly, with reference to FIG. 5I and with reference to all previous Figs., fifth metal segments 318aa, 318ab, 318ba and 318bb are deposited on substrate 112 in shadow mask deposition system 100 by way of a shadow mask having a pattern of apertures of the same geometry, dimensions and spacing as said fifth metal segments. Each fifth metal segment 318 is deposited overlapping an end of a corresponding first metal segment 310 adjacent corresponding semiconductor segment 320, and overlapping, but not completely covering, portions H and I of the corresponding second insulator segment 328.

Figure 6:
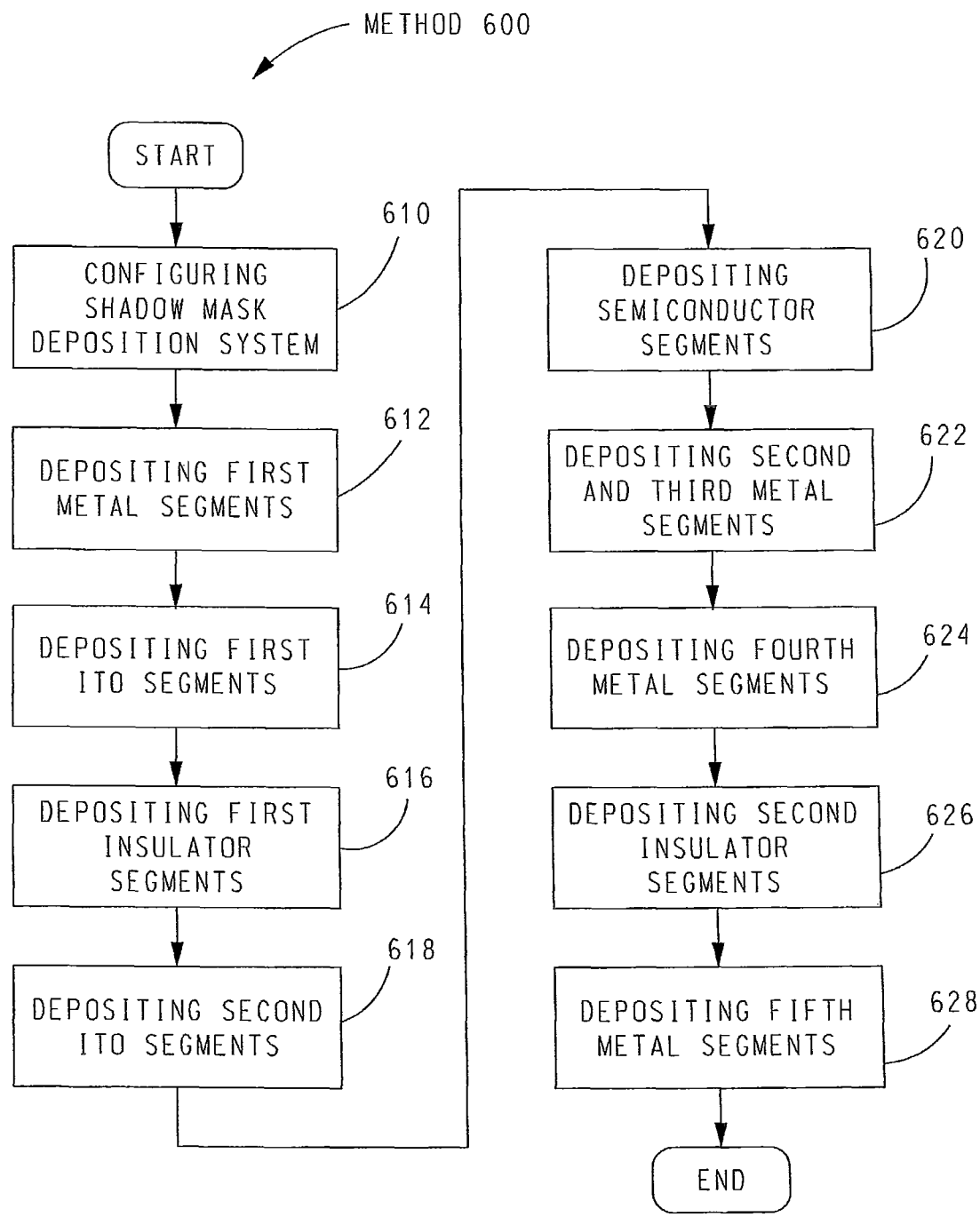
FIG. 6 is a flow diagram of a method of forming the sub-pixels of FIG. 4.

With reference to FIG. 6 and with continuing reference to all previous Figs., a method 600 of forming LCD pixel structure 400 includes step 610, wherein shadow mask deposition system 100 is configured to include nine serially arranged vacuum deposition chambers 110 with a substrate 112 translating therethrough. Each vacuum deposition chamber 110 includes a unique shadow mask 122 and a unique deposition source 118. Shadow mask deposition system 100, however, is not to be construed as limiting the invention since a shadow mask deposition system including one or more vacuum deposition chambers, each of which includes one or more shadow masks and one or more deposition sources, can be utilized. The former is assumed in the remaining steps of method 600.

The method then advances to step 612, wherein substrate 112 is translated into a first vacuum deposition chamber, such as deposition vacuum vessel 110a, wherein a plurality of first metal segments 310 is deposited thereon by way of a shadow mask, such as a shadow mask 122a, which has for each first metal segment 310 an aperture for passing evaporant material from the corresponding deposition source, such as a deposition source 118a, to form the first metal segment 310 on substrate 112.

The method then advances to step 614, wherein substrate 112 is translated into a second vacuum deposition chamber, such as deposition vacuum vessel 110b, wherein a plurality of first ITO segments 322 is deposited thereon by way of a shadow mask, such as a shadow mask 122b, which has for each first ITO segment 322 an aperture for passing evaporant material from the corresponding deposition source, such as a deposition source 118b, to form the first ITO segment 322 on substrate 112.

The method then advances to step 616, wherein substrate 112 is translated into a third vacuum deposition chamber, such as deposition vacuum vessel 110c, wherein a plurality of first insulator segments 326 is deposited thereon by way of a shadow mask, such as a shadow mask 122c, which has for each first insulator segment 326 an aperture for passing evaporant material from the corresponding deposition source, such as a deposition source 118c, to form the first insulator segment 326 on substrate 112.

The method then advances to step 618, wherein substrate 112 is translated into a fourth vacuum deposition chamber, such as deposition vacuum vessel 110d, wherein a plurality of second ITO segments 324 is deposited thereon by way of a shadow mask, such as a shadow mask 122d, which has for each second ITO segment 324 an aperture for passing evaporant material from the corresponding deposition source, such as a deposition source 118d, to form the second ITO segment 324 on substrate 112.

The method then advances to step 620, wherein substrate 112 is translated into a fifth deposition chamber, such as deposition vacuum vessel 110e, wherein a plurality of semiconductor segments 320 is deposited thereon by way of a shadow mask, such as a shadow mask 122e, which has for each semiconductor segment 320 an aperture for passing evaporant material from the corresponding deposition source, such as a deposition source 118e, to form the semiconductor segment 320 on substrate 112.

The method then advances to step 622 wherein substrate 112 is translated into a sixth vacuum deposition chamber, such as deposition vacuum vessel 110f, wherein a plurality of second metal segments 312 and a plurality of third metal segments 314 are concurrently deposited thereon by way of a shadow mask, such as a shadow mask 122f, which has for each second metal segment a corresponding aperture and which has for each third metal segment a corresponding aperture for passing evaporant material from the corresponding deposition source, such as a deposition source 118f, to form the second metal segment and the third metal segment 314 on substrate 112.

The method then advances to step 624, wherein substrate 112 is translated into a seventh vacuum deposition chamber, such as a deposition vacuum vessel 110g, wherein a plurality of fourth metal segments 316 is deposited thereon by way of a shadow mask, such as shadow mask 122g, which has for each fourth metal segment 316 an aperture for passing evaporant material from the corresponding deposition source, such as a deposition source 118g, to form the fourth metal segment 316 on substrate 112.

The method then advances to step 626, wherein substrate 112 is translated into an eighth vacuum deposition chamber, such as a deposition vacuum vessel 110h, wherein a plurality of second insulator segments 328 is deposited thereon by way of a shadow mask, such as a shadow mask 122h, which has for each second insulator segment 328 an aperture for passing evaporant material from a deposition source, such as a deposition source 118h, to form the second insulator segment 328 on substrate 112.

Lastly, the method advances to step 628, wherein substrate 112 is translated into a ninth vacuum chamber, such as a deposition vacuum vessel 110i, wherein a plurality of fifth metal segments is deposited thereon by way of a shadow mask, such as a shadow mask 122i, which has for each fifth metal segment 318 an aperture for passing evaporant material from the corresponding deposition source, such as a deposition source 118*i*, to form the fifth metal segment 318 on substrate 112.

In the foregoing description, only second metal segments 312 and third metal segment 314 were described as being deposited simultaneously in the same deposition vacuum vessel 110. However, this is not to be construed as limiting the invention since second metal segments 312 and third metal segments 314 can be deposited in separate deposition vacuum vessels 110. Moreover, any logical combination of metal segments 310, 312, 314, 316 and/or 318 can be deposited in a single deposition event by way of a single shadow mask, provided such shadow mask has sufficient structural rigidity to define the necessary aperture(s) to facilitate such deposition. For example, first ITO segments 322, first insulator segments 326 and second ITO segments 324 can be deposited in the manner and sequence described above. Semiconductor segments 320 can be deposited on or before the deposition of first ITO segments 322, first insulator segments 326 and second ITO segments 324. Next, a first metal deposition event can deposit metal corresponding to the metal segments 310, 312, 314 and/or 316 by way of a suitable shadow mask having a corresponding pattern of apertures. Thereafter, second insulator segments 328 and fifth metal segments 318 can be deposited in the manner described above. Thus, as few as two metal deposition events can be utilized to form LCD pixel structure 400 provided the mask for each metal deposition event has sufficient structural integrity to facilitate quality metal deposition. Accordingly, the number of deposition steps, the pattern of material deposited in each deposition step and the order of the deposition steps described above are not to be construed as limiting the invention.

With continuing reference to FIGS. 3-5I, each of the shadow masks utilized to deposit metal segments 310, 312, 314, 316 and 318, ITO segments 322 and 324, and insulator segment 326 and 328 is moved into intimate contact and held in intimate contact with substrate 112 during the deposition step or event in the corresponding deposition vacuum vessel 110. For example, when depositing first metal segments 310 (shown in FIGS. 3 and 5A), the shadow mask having the pattern of apertures of the same geometry, dimensions and spacing as first metal segments 310 is held in intimate contact with substrate 112 during deposition of first metal segments 310. In contrast, when depositing first ITO segments 322 (shown in FIGS. 3 and 5B), the shadow mask having the pattern of apertures of the same geometry, dimensions and spacing as first ITO segments 322 is held in intimate contact with the previously deposited first metal segments 310 and substrate 112 during deposition of first ITO segments 322. Similarly, the shadow masks utilized for depositing first insulator segments 326 (FIGS. 3 and 5C), second ITO segments 324 (FIGS. 3 and 5D), semiconductor segments 320 (FIGS. 3 and 5E), second and third metal segments 312 and 314 (FIGS. 3 and 5F), fourth metal segments 316 (FIGS. 3 and 5G), second insulator segments 328 (FIGS. 3 and 5H), and fifth metal segments 318 (FIGS. 3 and 5I) are each held in intimate contact with at least some previously deposited material or segments.

It has been observed that each shadow mask in contact with second metal segments 312 (the drain contacts of transistors 212) and fourth metal segments 316 (the source contacts of transistors 212), which in-turn are in contact with semiconductor segments 320, can accumulate static electricity during the deposition event that utilizes said shadow mask. Upon moving the shadow mask away from intimate contact with second and fourth metal segments 312 and 316 at the completion of a vapor deposition event, this static electricity can discharge (e.g., in the form of an electrical arc) through one or more semiconductor segments 320 thereby damaging said one or more semiconductor segments 320.

To avoid this potential discharge damage to one or more semiconductor segments 320, optional third and fourth insulator segments 330 and 332 (shown in phantom in FIG. 3) can be deposited atop of and in contact with second and fourth metal segments 312 and 316, respectively. To facilitate deposition of third insulator segments 330 atop of second metal segments 312, second and third metal segments 312 and 314 can be separately deposited utilizing separate shadow masks, each of which has a pattern of apertures of the same geometry, dimensions and spacing as the corresponding segment to be deposited. For example, second metal segments 312 can be deposited utilizing a shadow mask having a pattern of apertures of the same geometry, dimensions and spacing as said second metal segments 312, and third metal segments 314 can be deposited utilizing a shadow mask having a pattern of apertures of the same geometry, dimensions and spacing as said third metal segments 314.

Figure 7:
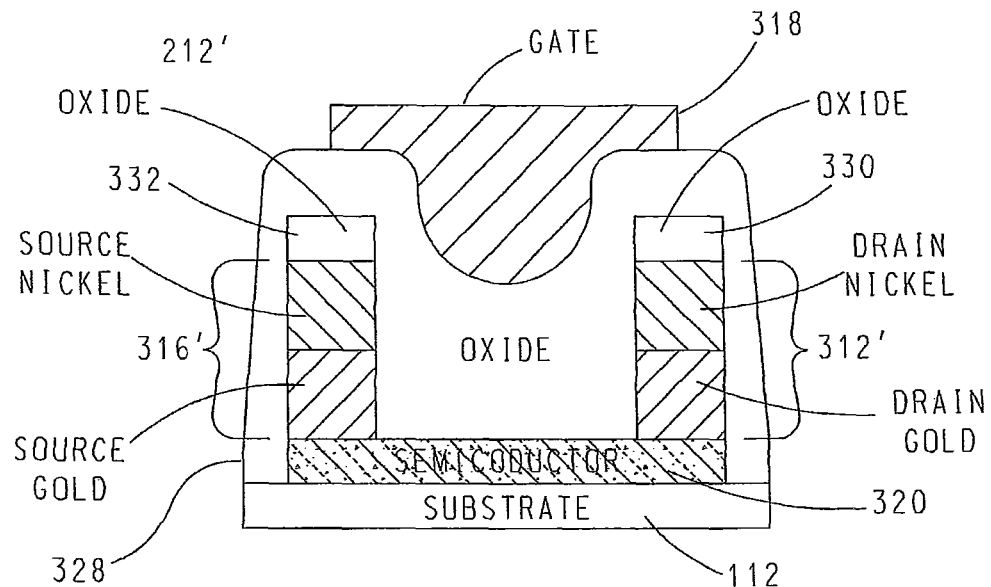
FIG. 7 is a section taken along lines VII-VII in FIG. 3 of an alternate embodiment transistor including insulator segments atop of the drain and source (second and fourth) metal segments.

With reference to FIG. 7 and with continuing reference to FIGS. 3-5I, at a suitable time after second metal segments 312 have been deposited, third insulator segments 330 can be deposited directly atop of and in contact with second metal segments 312. Desirably, third insulator segments 330 are deposited in the same vacuum deposition vessel 110 via the same shadow mask that were utilized to deposit second metal segments 312 prior to moving said shadow mask out of intimate contact with substrate 112 and any previously deposited segments that said shadow mask may be in contact with during vapor deposition of second metal segments 312 and third insulator segments 330. Alternatively, third insulator segments 330 can be deposited in a different vacuum deposition vessel 110 utilizing a different shadow mask that is in intimate contact with substrate 112 and which desirably has the same pattern of apertures of the same geometry, dimensions and spacing as the second metal segments 312.

Similarly, upon completion of the deposition of fourth metal segments 316, optional fourth insulator segments 332 can be deposited directly atop of and in contact with fourth metal segments 316. Desirably, fourth insulator segments 332 are deposited in the same vacuum deposition vessel 110 via the same shadow mask that were utilized to deposit the fourth metal segments 316 prior to moving said shadow mask out of intimate contact with substrate 112 and any previously deposited segments that said shadow mask may be in contact with during vapor deposition of fourth metal segments 316 and fourth insulator segments 332. Alternatively, fourth insulator segments 332 can be deposited in a different vacuum deposition vessel 110 utilizing a different shadow mask that is in intimate contact with substrate 112 and which desirably has the same pattern of apertures of the same geometry, dimensions and spacing as fourth metal segments 316.

In a non-limiting embodiment, third metal segments 314 are deposited after deposition of second metal segments 312 and third insulator segments 330, but prior to deposition of fourth metal segments 316 and fourth insulator segments 332. In this case, during deposition of third metal segments 314, the shadow mask utilized for depositing third metal segments 314 is desirably held in intimate contact with, among other things, at least portions of third insulator segments 330. This contact between said shadow mask and third insulator segments 330 avoids damage to semiconductor segments 320 caused by the accumulation of static electricity in said shadow mask during deposition of third metal segments 314 upon moving said shadow mask out of intimate contact with third insulator segments 330 upon completion of the deposition of third metal segments 314. In a similar manner, third insulator segments 330 avoid damage to semiconductor segments 320 caused by the buildup of static electricity in any shadow mask that comes into contact with third insulator segments 330 during a deposition step or event.

Similarly, in another non-limiting embodiment, during deposition of second insulator segments 328, the shadow mask utilized for depositing second insulator segments 328 is held in intimate contact with, among other things, at least portions of fourth insulator segments 332 deposited atop of fourth metal segments 316. This contact between said shadow mask and fourth insulator segments 332 avoids damage to semiconductor segments 320 caused by the accumulation of static electricity in said shadow mask during deposition of second insulator segments 328 upon moving said shadow mask out of intimate contact with fourth insulator segments 332 upon completion of the deposition of second insulator segments 328. In a similar manner, fourth insulator segments 332 avoid damage to semiconductor segments 320 caused by the buildup of static electricity in any shadow mask that comes into contact with fourth insulator segments 332 during a deposition step or event.

Third and fourth insulator segments 330 and 332 can be formed of any transparent, electrically non-conductive material that is depositable via a shadow mask deposition process, such as, without limitation, aluminum oxide ($Al_2O_3$) or silicon dioxide ($SiO_2$).

Heretofore, each second metal segment 312 has been described and illustrated as being a single layer of material and each fourth metal segment 316 has been described and illustrated as being a single layer of material. If desired, however, each second metal segment 312 can be formed from a stack of conductive (e.g., metal) layers 312' of the same or different materials deposited in the same vacuum vessel 110 utilizing the same shadow mask or in different vacuum vessels 110 utilizing different shadow masks. Also or alternatively, each fourth metal segments 316 can be formed from a stack of conductive (e.g., metal) layers 316' of the same or different materials deposited in the same vacuum vessel 110 utilizing the same shadow mask or in different vacuum vessels 110 utilizing different shadow masks.

For example, in one non-limiting embodiment shown in FIG. 7, stack 312' can include a base layer of drain gold atop of and in contact with one part of semiconductor segment 320 and a layer of drain nickel between and in contact with the drain gold layer and third insulator segment 330, and stack 316' can include a base layer of source gold atop of and in contact with another part of semiconductor segment 320 and a layer of source nickel between and in contact with the source gold layer and fourth insulator segment 332. If desired, stack 312' can be utilized with or without third insulator segment 330 and/or stack 316' can be utilized with or without fourth insulator segment 332.

It is believed that stacks 312' and 316' made of different materials improve adhesion of third and fourth insulator segments 330 and 332 to substrate 112 and, hence, the ability of third and fourth insulator segments 330 and 332 to act as insulators that avoid damage to semiconductor segment 320 due to the discharge of static electricity accumulated in shadow masks during vapor deposition events upon moving said shadow masks out of intimate contact with substrate 112 upon completion of said vapor deposition events. FIG. 7 is an alternate embodiment transistor 212' that can be used in place of transistor 212, including third and fourth insulator segments 330 and 332, shown in FIG. 3.

Figure 8:
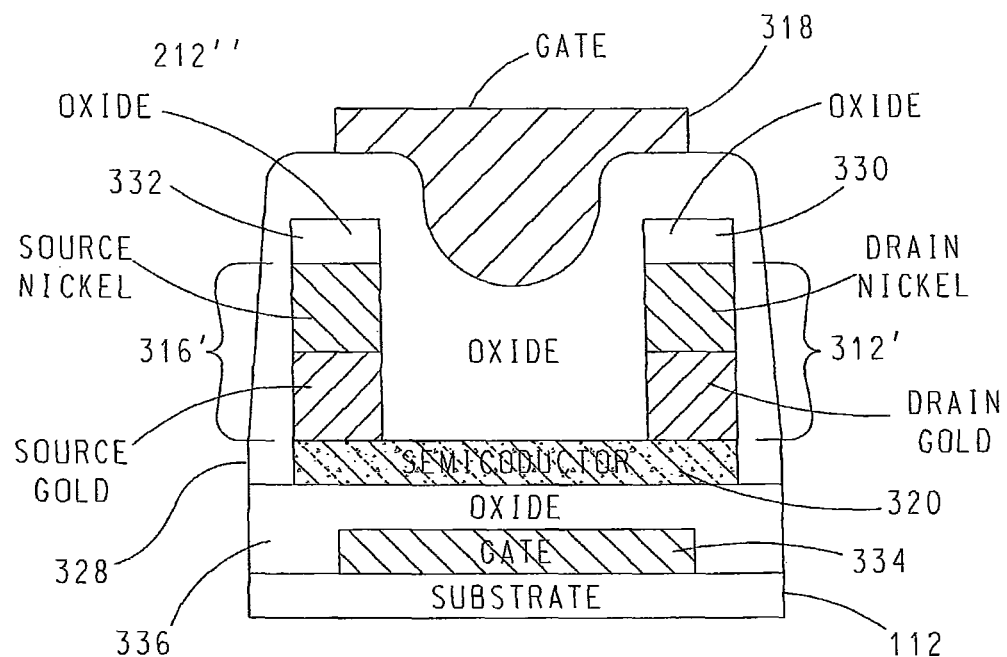
FIG. 8 is another alternate embodiment transistor based on the transistor shown in FIG. 7.

With reference to FIG. 8 and with continuing reference to FIG. 7, another alternate embodiment transistor 212" that can be used in place of transistor 212, including third and fourth insulator segments 330 and 332, shown in FIG. 3, has the same structure as transistor 212' in FIG. 7 but further includes a sixth metal segment 334 atop and in contact with substrate 112 and in alignment with semiconductor segment 320, and fifth insulator segment 336 separating sixth metal segment 334 and semiconductor segment 320. Fifth and sixth metal segments 318 and 334 in FIG. 8 can define upper and lower gates of transistor 212" that can be biased in a manner known in the art to effect the operation of transistor 212" in a desired manner. For example, depending on whether transistor 212" is an n-channel or p-channel transistor, suitable positive and negative biases (or vice versa) can be applied to fifth and sixth metal segments 318 and 334, respectively, as necessary to bias semiconductor segment 320 into conduction or turnoff as desired.

The present invention has been described with reference to the preferred embodiments. Obvious modifications and alterations will occur to others upon reading and understanding the preceding detailed description. For example, pulse signal 234 and second voltage 232 are illustrated as being positive voltages. However, this is not to be construed as limiting the invention since second voltage 232 can be a positive or negative voltage and pulsed signal 234 can be a positive or negative voltage depending upon whether the corresponding transistor is a PNP or NPN transistor. It is intended that the invention be construed as including all such modifications and alterations insofar as they come within the scope of the appended claims or the equivalents thereof.

The invention claimed is:

1. A shadow mask vapor deposition method comprising:
   (a) shadow mask vapor depositing a semiconductor segment;
   (b) shadow mask vapor depositing an electrically conductive drain contact on a first part of the semiconductor segment;
   (c) shadow mask vapor depositing a first insulator on the drain contact;
   (d) shadow mask vapor depositing an electrically conductive source contact on a second part of the semiconductor segment spaced from the drain contact;
   (e) shadow mask vapor depositing a second insulator on the source contact;
   (f) shadow mask vapor depositing a third insulator over at least part of each of the first and second insulators and the semiconductor segment between the drain contact and the source contact; and
   (g) shadow mask vapor depositing an electrically conductive gate contact on the third insulator and in spaced relation to the semiconductor segment between the drain contact and the source contact.

2. The method of claim 1, wherein steps (b) and (c) are performed in the same deposition vacuum vessel utilizing the same shadow mask.

3. The method of claim 1, wherein steps (d) and (e) are performed in the same deposition vacuum vessel utilizing the same shadow mask.

4. The method of claim 1, wherein steps (a), (f), and (g) are each performed in a different deposition vacuum vessel utilizing a different shadow mask.

5. The method of claim 1, wherein steps (a)-(g) are each performed in a different deposition vacuum vessel utilizing a different shadow mask.

6. The method of claim 1, wherein the first insulator, the second insulator, or both contact at least one shadow mask during at least one vapor deposition event.

7. The method of claim 1, wherein the semiconductor segment is deposited on a substrate.

8. The method of claim 1, wherein the semiconductor segment is deposited on a shadow mask vapor deposited fourth insulator which is shadow mask vapor deposited on another electrically conductive gate contact which is shadow mask vapor deposited on a substrate.

9. The method of claim 1, wherein the drain contact, the source contact, or both are made from layers of different conductive materials that have been separately shadow mask vapor deposited.

* * * * *